United States Patent [19]
Jiang et al.

[11] Patent Number: 5,299,156
[45] Date of Patent: * Mar. 29, 1994

[54] DUAL PORT STATIC RAM WITH BIDIRECTIONAL SHIFT CAPABILITY

[75] Inventors: Ching-Lin Jiang, Dallas; Clark R. Williams, Plano, both of Tex.

[73] Assignee: Dallas Semiconductor Corp., Dallas, Tex.

[*] Notice: The portion of the term of this patent subsequent to Oct. 10, 2006 has been disclaimed.

[21] Appl. No.: 542,689

[22] Filed: Jun. 25, 1990

Related U.S. Application Data

[63] Continuation of Ser. No. 404,155, Sep. 7, 1989, abandoned, which is a continuation of Ser. No. 203,424, Jun. 7, 1988, Pat. No. 4,873,665.

[51] Int. Cl.$^5$ .................................................. G11C 11/419
[52] U.S. Cl. .................................. 365/154; 365/156; 365/189.12; 365/230.05
[58] Field of Search ................. 365/154, 156, 189.04, 365/190, 202, 221, 228, 230.05, 78, 189.12; 377/64, 67, 69, 77, 79, 80, 81

[56] References Cited

U.S. PATENT DOCUMENTS

| | | | |
|---|---|---|---|
| 4,435,787 | 3/1984 | Yasuoka | 365/190 |
| 4,616,347 | 10/1986 | Bernstein | 365/230.05 |
| 4,805,139 | 2/1989 | Norris | 365/78 |
| 4,813,015 | 3/1989 | Spak et al. | 365/78 |
| 4,825,409 | 4/1989 | Bessolo et al. | 365/154 |

FOREIGN PATENT DOCUMENTS 0291168 12/1987 Japan .................................. 365/154

*Primary Examiner*—Glenn Gossage
*Attorney, Agent, or Firm*—Worsham, Forsythe, Sampels & Wooldridge

[57] ABSTRACT

A dual storage cell memory includes an array of dual storage cells, each of the dual storage cells containing a first memory cell and a second memory cell. The first and second memory cells are well known six-transistor static memory cells with the addition of transfer circuitry for transferring data directly from the internal data nodes of each of the memory cells to its corresponding complementary memory cell without requiring the use of the enable transistors or the bit lines associated with each of the dual storage cells.

3 Claims, 2 Drawing Sheets

DUAL PORT STATIC RAM WITH BIDIRECTIONAL SHIFT CAPABILITY

This is a continuation of application Ser. No. 07/404,155, filed Sep. 7, 1989, now abandoned, which is a continuation of application Ser. No. 07/203,424, filed Jun. 7, 1988, now U.S. Pat. No. 4,873,665.

TECHNICAL FIELD

This invention relates to electronic memories, and more particularly, to memories used to transfer data between asynchronous systems.

BACKGROUND OF THE INVENTION

A common occurrence in digital electronic systems is the requirement to transfer data between two asynchronous systems, that is, two systems which have independent clocks and are therefore not synchronized with each other. A common method used in the past to transfer such data is to use a first in, first out (FIFO) serial memory in which data from the transmitting system is written into the serial memory at the transmitting system's clock rate and read from the serial memory at the receiving system's clock rate. This FIFO memory generally uses a dual port memory cell so that data can be written into each memory cell independently of the data being read out of the memory cell.

However, this FIFO system is useful only for the transmission of data in one direction only and is, therefore, not suitable for interfacing between two systems in which data is to be transferred in both directions. In certain situations this bidirectional transfer of data can most advantageously be accomplished using a common memory between the two systems in which each system can both write data into the memory and read data from the memory at their own independent clock rates.

Therefore, it can be appreciated that a shared memory system which permits two asynchronous systems to both write data into the memory and read data from the memory is highly desirable.

SUMMARY OF THE INVENTION

It is, therefore, an object of this invention to provide a memory system which permits two asynchronous systems to both write data into the memory and read data from the memory.

Shown in an illustrated embodiment of the invention is a memory which includes first and second memory cells, each memory cell having a first and second data node. The memory includes first circuitry coupled to the first and second data nodes of the first memory for transferring data into and out of the first memory independent of the data stored in the second memory cell and includes second data transfer circuitry coupled to the first and second data nodes of the second memory cell for transferring data into and out of the second memory cell independent of the data stored in the first memory cell. The memory also includes third data transfer circuitry separate from the first and second data transfer circuitry. The third data transfer circuitry is coupled to the first and second data nodes of both the first and second memory cells and operates to transfer data between the first and second memory cells.

Also shown in an illustrated embodiment of the invention is a memory array which includes a plurality of memory cells arranged in rows and columns. Each of the memory cells includes a first and second storage cell wherein each of the first storage cells has a first enable line and a first pair of true and complementary bit lines and each of the second storage cells has a second enable line and a second pair of true and complementary bit lines, Each of the first enable lines of each row of the memory cells are coupled together to form a common first enable line for each row of the memory array and each of the second enable lines of each row of the memory cells are coupled together to form a common second enable line for each row of the memory array. Also, each of the first pair of true and complementary bit lines of each column of the memory array are coupled together to form a common first pair of true and complementary bit lines for each column, and each of the second pair of true and complementary bit lines of each column of the memory array are coupled together to form a common second pair of true and complementary bit lines for each column.

BRIEF DESCRIPTION OF THE DRAWINGS

The aforementioned and other features, characteristics, advantages, and the invention in general, will be better understood from the following, more detailed description taken in conjunction with the accompanying drawings in which.

Figure 1:
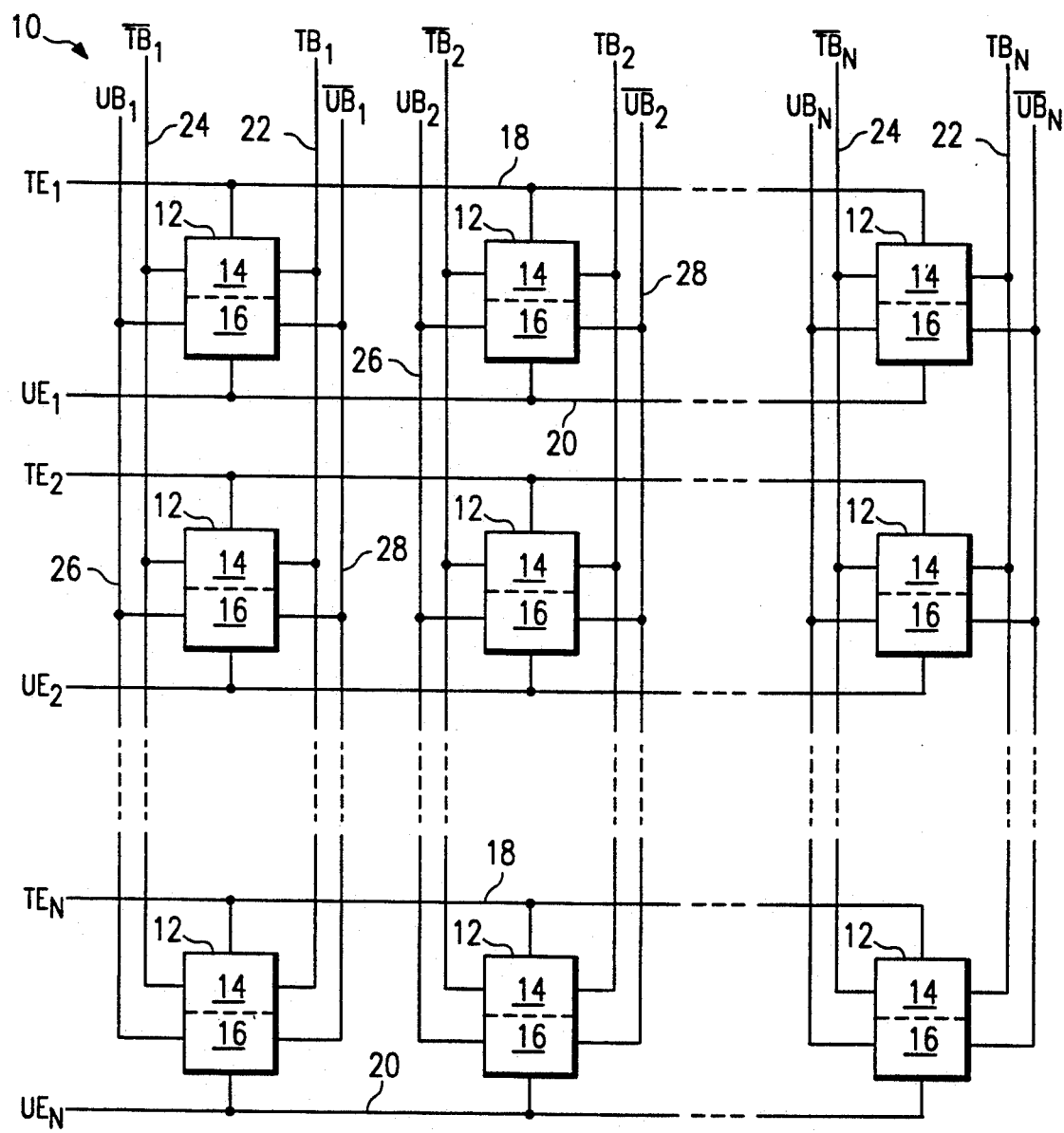
FIG. 1 is a block diagram of a memory array which includes dual storage cells according to the present invention.

It will be appreciated that for purposes of clarity and where deemed appropriate, reference numerals have been repeated in the figures to indicate corresponding features.

DESCRIPTION OF THE PREFERRED EMBODIMENT

A memory array having dual storage cells in the preferred embodiment of the present invention has a plurality of dual storage cells arranged in rows and columns. Each of the dual storage cells has a first memory cell, referred to as a timekeeping memory cell in the preferred embodiment, and a second memory cell, referred to as a user memory cell. Each of the first and second memory cells has separate pairs of true and complementary bit lines which are common to all of the first memory cells in each column of the memory array. Similarly, each of the second memory cells is coupled to a second pair of true and complementary bit lines which are common to each of the second memory cells in each column of the array. Each of the first memory cells has an enable line connected thereto which is shared by each of the first memory cells in each row of the array, and each of the second memory cells has a second enable line which is shared by each of the second memory cells in each row of the array.

In the preferred embodiment, both the first and second memory cells are six-transistor static random access memory (RAM) cells which are well known to those skilled in the art. Each of the data cells has a first enable transistor which couples one of the bit lines, for example the true bit line, to a first data node inside the memory cell and a second enable transistor which couples the other bit line, the complementary bit line in this example, to the second data node inside the memory cell. The dual storage cell according to the present invention also includes data transfer circuitry for transferring the data directly between the first memory cell and the second memory cell. More specifically, four sets of series connected n-channel transistors connect each of the data nodes of the two memory cells to ground. The gate of one of these transistors in each of the four sets is connected to an external signal to enable the data transfer from one of the memory cells to the other, and the gate of the second transistor is connected to the opposite data node of the opposite memory cell. For example, the first data node of the first memory cell is coupled to ground through the series connection of two n-channel transistors. One of these n-channel transistors is driven by an external signal which will transfer the data from the second memory cell to the first memory cell, and the gate of the second transistor is connected to the second data node of the second memory cell. Similarly, the second data node of the first memory cell is coupled to ground through two n-channel transistors, one of which is driven by the external signal and the other is gated by the voltage at the first data node of the second memory cell.

In operation when data is to be transferred from the second memory cell to the first memory cell, the external signal activates or makes conductive one of the two series transistors connected between the data nodes of the first memory cell and ground. If the first data node of the second memory cell is at a logic 1 level, then the second data node of the first memory cell will be pulled to ground since both of the series transistors connected between the second data node of the first memory cell will be conducting. Since the data nodes of the cell are complementary, in this example the second data node of the second memory cell will be at a logic 0 level and, therefore, the first data node of the first memory cell will be isolated from ground. This grounding of the second data node of the first memory cell forces the memory cell to assume a logic condition in which the first data node is at a logic 1 level and the second data node is at a logic 0 level. Thus, by the application of the external transfer signal, the data has been transferred from the second memory cell to the first memory cell without activating the enable transistors coupled between the data nodes and the bit lines.

Turning now to the drawings, FIG. 1 is a block diagram of a memory array 10 which contains a plurality of dual storage cells 12 according to the present invention. Each of the dual storage cells 12 includes a first memory cell 14 and a second memory cell 16. The dual storage cells 12 are arranged in rows and columns as shown in FIG. 1. The upper memory cells 14 of each of the dual storage cells 12 is enabled by an enable line 18 which is shown as TE in FIG. 1. Similarly, each of the lower memory cells 16 is enabled by an enable line 20 shown as UE in FIG. 1. The upper memory cell 14 has connected to it a true bit line 22 shown as TB and a complementary bit line 24 shown as $\overline{TB}$. Similarly, the lower memory cell 16 has connected to it a true bit line 26 shown as UB and a complementary bit line 28 shown as $\overline{UB}$.

Figure 2:
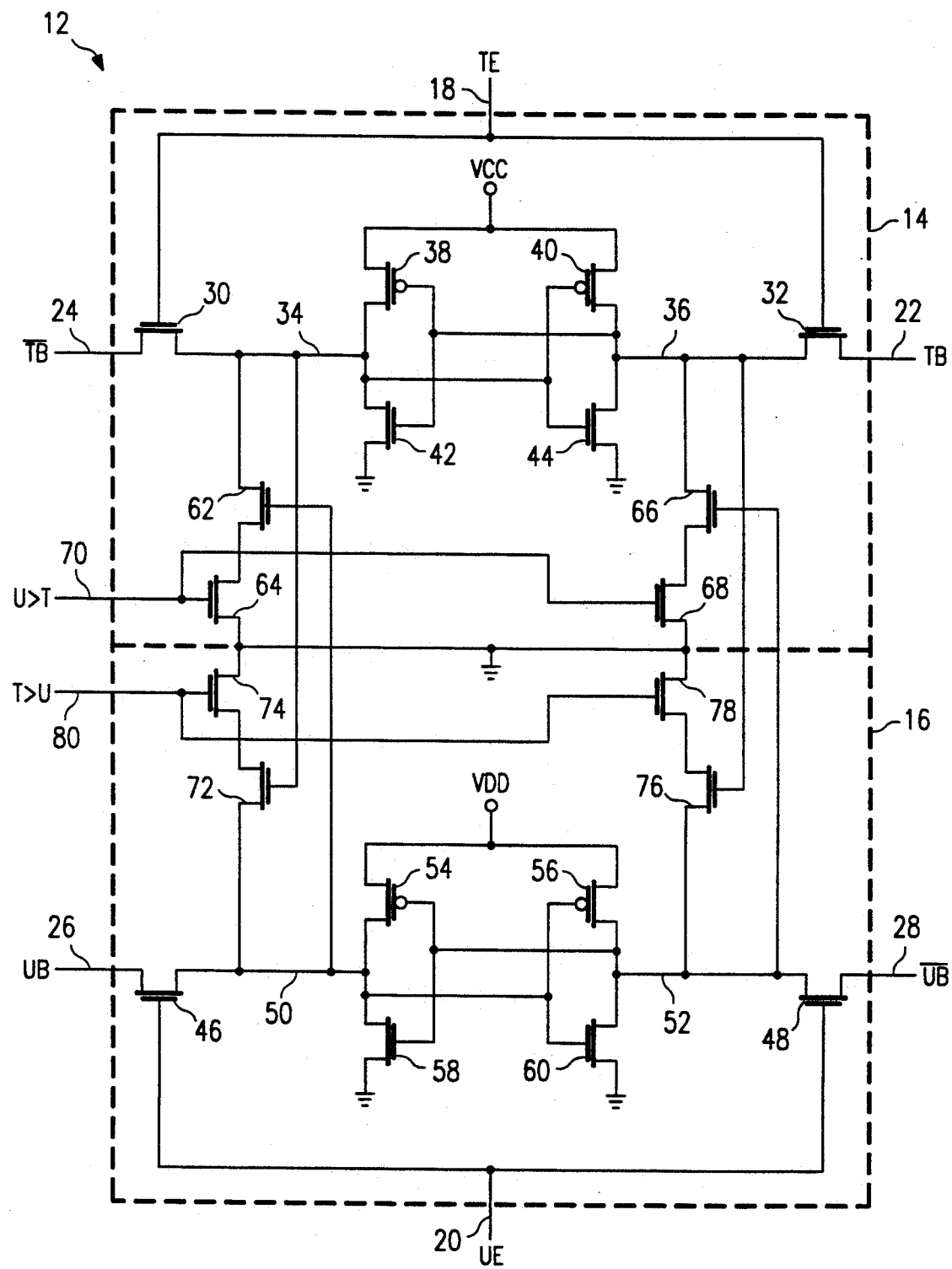
FIG. 2 is a schematic diagram of a dual storage cell shown in FIG. 1.

A dual storage cell 12 is shown in detail in FIG. 2. The upper memory cell 14 includes two enable transistors 30 and 32 which are gated by the TE line 18, the source of the enable transistor 30 is connected to the $\overline{TB}$ line 24, and the drain of the enable transistor 30 is connected to a first data node 34 of the upper memory cell 14. The source of the enable transistor 32 is connected to the TB line 22 and the drain of the enable transistor 32 is connected to a second data node 36 of the upper memory cell 14. Coupled between the data nodes 34 and 36 are four transistors, two p-channel transistors 38 and 40 and two n-channel transistors 42 and 44, which are connected as cross coupled inverters in a standard six-transistor configuration.

The lower memory cell 16 also contains two enable transistors, a first enable transistor 46 and a second enable transistor 48. The gates of the enable transistors 46 and 48 are connected together and to the enable signal UE on line 20. The source of the enable transistor 46 is connected to the UB bit line 26 and the drain of the enable transistor 46 is connected to a first data node 50 of the lower memory cell 16. The source of the enable transistor 48 is connected to the $\overline{UB}$ bit line 28 and the drain of the enable transistor 48 is connected to a second data node 52 of the lower memory cell 16. Connected between the first data node 50 and the second data node 52 are four transistors, two p-channel transistors 54 and 56 and two n-channel transistors 58 and 60. The four transistors 54, 56, 58, and 60 form two inverters in a standard six-transistor configuration.

The upper memory cell 14 also contains data transfer circuitry consisting of two sets of two n-channel transistors, each set connected between one data node 34 or 36, and ground. More specifically, a first n-channel transistor 62 has its drain connected to the first data node 34 and its source connected to the drain of a second n-channel transistor 64, the source of which is connected to ground. Similarly, another n-channel transistor 66 has its drain connected to the second data node 36 and its source connected to the drain of another n-channel transistor 68, the source of which is connected to ground. The gates of the n-channel transistors 64 and 68 are connected together and to a signal labeled $U>T$ on a line 70. The gate of the n-channel transistor 62 is connected to the first data node 50 of the lower memory cell 16 and the gate of the n-channel transistor 66 is connected to the second data node 52 of the lower memory cell 16.

In a complementary manner, the first and second data nodes of the second memory cell are each connected through a series path of two n-channel transistors to ground. More specifically, a first n-channel transistor 72 has its drain connected to the first data node 50 and its source connected to the drain of another n-channel transistor 74, the source of which is connected to ground. Another n-channel transistor 76 has its drain connected to the second data node 52 and its source connected to the drain of another n-channel transistor 78, the source of which is connected to ground. The gates of the n-channel transistors 74 and 78 are connected together and are driven by a signal labeled $T>U$ on a line 80. The gate of the n-channel transistor 72 is connected to the first data node 34 of the upper memory cell 14, and the gate of the n-channel transistor 76 is connected to the second data node 36 of the upper memory cell 14.

The $U>T$ signal line 70 and the $T>U$ signal line 80 are not shown in FIG. 1. In the preferred embodiment the $T>U$ signal line 80 for each of the memory cells 12 is connected together to form a single $T>U$ line for the memory array 10, while there are separate $U>T$ lines for groups of eight memory cells 12 in the memory array 10.

In operation, when the signals $U>T$ and $T>U$ on line 70 and 80 respectively are at a logic 0 level, then the upper memory cell 14 and lower memory cell 16 operate as normal six-transistor static memory cells. Advantageously, data can be transferred from the upper memory cell 14 to the lower memory cell 16 or from the lower memory cell 16 to the upper memory cell 14, by the application of a single voltage level on the T>U signal on line 80, or the application of the U>T signal on line 70, respectively. More specifically, when data is to be transferred from the upper memory cell 14 to the lower memory cell 16, a logic 1 level on the T>U signal line 80 enables the n-channel transistors 74 and 78. Since the first and second data nodes 34 and 36 of the upper memory cell 14 have complementary data, then one of the n-channel transistors 72 or 76 will be enabled or made conductive and the other will be disabled or made nonconductive. For example, if the first data node 34 is a logic 1 level and the second data node 36 is a logic 0 level, then transistor 72 will be enabled and transistor 76 will be disabled. Under these conditions, the first data node 50 of the lower memory cell 16 will be pulled to ground through the n-channel transistor 72 and 74 anti the second data node 52 will remain isolated since the n-channel transistor 76 is disabled. This action will transfer the data from the upper memory cell to the lower memory cell.

Conversely, the data in the lower memory cell 16 can be transferred to the upper memory cell 14 by placing a logic 1 level on the U>T signal line 70 which will enable the n-channel transistor 64 and 68. Since the first and second data nodes 50 and 52 of the lower memory cell 16 have complementary data on them, one of the n-channel transistors 62 and 66 will be enabled and the other will be disabled. Thus, in the same manner as described above, the data in the lower memory cell 16 will be transferred into the upper memory cell 14.

Advantageously, the transfer of data between the two memory cells operates by grounding one of the data nodes of the receiving memory cell without sourcing or sinking current from the other memory cell. Since the ground is available in each of the memory cells and can be coupled through the memory array with a metal line, the present invention allows the data transfer to occur without having to discharge the capacitive charge associated with each of the data nodes through a signal line running through the memory array. Thus, the U>T signal and the T>U signal on lines 70 and 80 can be relatively high impedance lines since they are not used to directly charge or discharge the data nodes of the memory cells.

In the preferred embodiment of the invention, these dual memory cells 12 are used in a timekeeping circuit in which the upper memory cell 14 contains data for use by timekeeping circuitry and the lower memory cell 16 holds data for use by a user. Thus, the timekeeping circuitry reads data from the upper memory cells 14 and writes data back into the upper memory cells 14, and the user reads data from the lower memory cell 16 and writes data into the lower memory cell 16. At appropriate times, for example after the timekeeping circuitry updates the upper memory cells 14, the T>U line 80 is brought to a logic 1 level to transfer the updated time from the timekeeping circuitry consisting of the upper memory cell 14 into the user memory consisting of the lower memory cell 16. Similarly, when a user writes new time data into the lower memory cell 16, the signal U>T on line 70 is brought to a logic 1 level to transfer the data from the user section into the timekeeping section. Thus, both the timekeeping circuitry and the user may asynchronously read and write data into their own section of each of the dual memory cells 12 and, following either a write operation by the timekeeping circuitry or by the use-. circuitry, the appropriate data transfer occurs so that the timekeeping memory consisting of the upper memory cells 14 and the user memory consisting of the lower memory cells 16 contain the same data.

Thus has been described a memory array which can be used to transfer data between two asynchronous systems so that each system can both write data into the memory and read data from the memory.

Although the invention has been described in part by making detailed reference to a certain specific embodiment, such detail is intended to be, and will be understood to be, instructional rather than restrictive. It will be appreciated by those skilled in the art that many variations may be made in the structure and mode of operation without departing from the spirit and scope of the invention as disclosed in the teachings contained herein.

What is claimed is:
1. An integrated circuit memory, comprising:
first and second pluralities of bitline pairs;
an array of dual storage cells;
  each dual storage cell of said array of dual storage cells comprising a first latch connected between a first pair of data nodes and a second latch connected between a second pair of data nodes;
  and each dual storage cell of said array of dual storage cells further comprising a first pair of pass transistors connected to said first pair of data nodes and a second pair of pass transistors connected to said second pair of data nodes;
  said first pair of pass transistors of each dual storage cell of said array of dual storage cells connected to one pair of said first plurality of bitline pairs, and
  said second pair of pass transistors of each dual storage cell of said array of dual storage cells connected to one pair of said second plurality of bitline pairs;
each dual storage cell of said array of dual storage cells connected to receive first and second control signals;
and each dual storage cell of said array of dual storage cells further comprising a transfer circuit
wherein, for each dual storage cell of said array of dual storage cells, the transfer circuit is coupled to said first and second pairs of data nodes and configured
  to drive one data node of said second pair of data nodes when said first control signal is activated, which data node driven determined in accordance with logic levels of said first pair of data nodes and
  to drive one data node of said first pair of data nodes when said second control signal is activated, which data node of said first pair of data nodes driven determined in accordance with logic levels of said first pair of data nodes.
2. The memory of claim 1,
wherein each latch is a CMOS latch;
and wherein each first pair of data nodes has a first node and a second node and each second pair of data nodes has a first node and a second node;
and wherein, for each dual storage cell of said array of dual storage cells, the transfer circuit includes
  a first pair of NMOS transistors connected in series between said first node of said first pair of data nodes and ground, said first pair of NMOS tran- sistors configured to drive said first node of said first pair of data nodes toward ground if said first node of said second pair of data nodes is high and said first control signal is high;

a second pair of NMOS transistors connected in series between said second node of said first pair of data nodes and ground, said second pair of NMOS transistors configured to drive said second node of said first pair of data nodes toward ground if said second node of said second pair of data nodes is high and said first control signal is high;

a third pair of NMOS transistors connected in series between said first node of said second pair of data nodes and ground, said third pair of NMOS transistors configured to drive said first node of said second pair of data nodes toward ground if said first node of said first pair of data nodes is high and said second control signal is high; and a fourth pair of NMOS transistors connected in series between said second node of said second pair of data nodes and ground, said fourth pair of NMOS transistors configured to drive said second node of said second of said second pair of data nodes toward ground if said second node of said first pair of data nodes is high and said second control signal is high.

3. The memory of claim 1, wherein, for each of dual storage cells of said array of dual storage cells, said first and second latches are CMOS static latches.

* * * * *

UNITED STATES PATENT AND TRADEMARK OFFICE
CERTIFICATE OF CORRECTION

PATENT NO. : 5,299,156
DATED : Mar. 29, 1994
INVENTOR(S) : Ching-Lin Jiang, et al It is certified that error appears in the above-indentified patent and that said Letters Patent is hereby corrected as shown below:

```
Column  6, line 51, after "node", insert --of said second pair of
   data nodes--;
Column  6, line 58, change "first" to --second--.
```

Signed and Sealed this

Twenty-sixth Day of March, 1996

Attest:

BRUCE LEHMAN

*Attesting Officer*  *Commissioner of Patents and Trademarks*